United States Patent
Periasamy et al.

(10) Patent No.: US 8,479,068 B2
(45) Date of Patent: Jul. 2, 2013

(54) DECODED REGISTER OUTPUTS ENABLING TEST CLOCK TO SELECTED ASYNCHRONOUS DOMAINS

(75) Inventors: Pradeep Periasamy, Bangalore (IN); Anand Bhat, Bangalore (IN); Tamilselvi Natarajan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 358 days.

(21) Appl. No.: 12/776,443

(22) Filed: May 10, 2010

(65) Prior Publication Data
US 2011/0276849 A1 Nov. 10, 2011

(51) Int. Cl.
*G01R 31/28* (2006.01)
(52) U.S. Cl.
USPC .......................................................... 714/731
(58) Field of Classification Search
USPC .......................................... 714/726, 727, 731
See application file for complete search history.

(56) References Cited

U.S. PATENT DOCUMENTS

| 7,206,983 | B2 * | 4/2007 | Alyamani et al. | 714/729 |
| 7,322,000 | B2 * | 1/2008 | Colunga et al. | 714/727 |
| 7,752,513 | B2 * | 7/2010 | Namura et al. | 714/726 |
| 7,872,490 | B2 * | 1/2011 | Fukunaga et al. | 326/16 |
| 7,917,823 | B2 * | 3/2011 | Dehnert et al. | 714/731 |
| 8,028,209 | B2 * | 9/2011 | Li et al. | 714/731 |
| 8,103,925 | B2 * | 1/2012 | Hapke et al. | 714/726 |
| 8,112,686 | B2 * | 2/2012 | Hapke et al. | 714/733 |

* cited by examiner

*Primary Examiner* — James C Kerveros
(74) *Attorney, Agent, or Firm* — Lawrence J. Bassuk; W. James Brady; Frederick J. Telecky, Jr.

(57) ABSTRACT

A system, circuit, and device for asynchronously scan capturing multi-clock domains. A system includes a shift register configured to process select data for selecting a clock domain at a time in response to a scan capture pulse and a one-hot n-to-$2^n$ decoder connected to the shift register and configured to generate one-hot code based on the select data. The system also includes integrated clock gating cells connected to the one-hot n-to-$2^n$ decoder, where the scan capture pulse is applied to each one of the integrated clock gating cells, and where only one of the integrated clock gating cells associated with the clock domain is enabled when the one-hot code is processed by the integrated clock gating cells. Further, the system includes multiplexers connected to the integrated clock gating cells, where the multiplexers are configured to forward the scan capture pulse to the clock domain.

2 Claims, 6 Drawing Sheets

DECODED REGISTER OUTPUTS ENABLING TEST CLOCK TO SELECTED ASYNCHRONOUS DOMAINS

TECHNICAL FIELD

Embodiments of the disclosure generally relate to the field of electronics, and more particularly to scan capture systems, circuits, and devices.

BACKGROUND

In tandem with automatic test pattern generation (ATPG) tools, scan design techniques are used to efficiently test chips using many test vectors that provide high fault coverage. In a typical scan design technique, a scan chain or multiple scan chains may be formed in a chip, such as a system-on-chip (SOC), by connecting flip-flops in the chip as one or more long shift registers when a scan mode is asserted for the chip. During the scan mode, a scan shift operation or a scan capture operation may be performed. When the scan shift operation is asserted, one or more test patterns may be loaded onto the scan chain(s). During the scan shift operation, the normal operation of the chip may be ceased. Once the loading of the test pattern(s) is completed, the scan capture operation may be asserted. During the scan capture operation, pseudo-functional operation of the chip may be performed based on functional inputs to the chip as well as the test pattern(s) loaded onto the scan chain(s). Then, the result of the scan capture operation may be shifted out during the subsequent scan shift operation, where the result may be compared with the expected pattern to verify the sound operation of the chip.

Today's SOCs have design blocks operating with different clocks and frequencies, i.e., multi-clock domains. During the chip's functional operation, the interface across the multi-clock domains are asynchronous and not timing critical. This allows the clock trees for different clocks associated with the multi-clock domains to be balanced independently. However, during the scan mode where elements of the chip are clocked by a single scan clock from a tester (e.g., an external tester), timing issues do appear. In the case of the scan-shift operation, the clock imbalance across the multi-clock domains may be solved either by isolating scan chains of the different clock domains or by using lockup latches wherever data crosses one or more of the multi-clock domains. But during the scan-capture operation, where so many data paths violate timing across the imbalanced clock trees, it may be difficult to solve the clock imbalance across the multi-clock domains.

SUMMARY

This summary is provided to comply with 37 C.F.R. §1.73, requiring a summary of the invention briefly indicating the nature and substance of the invention. It is submitted with the understanding that it will not be used to interpret or limit the scope or meaning of the claims.

Systems, circuits, and devices for asynchronously scan capturing multi-clock domains are disclosed. In one aspect, a system for asynchronously scan capturing multi-clock domains in a system-on-chip (SOC) during a scan capture operation includes a shift register configured to process select data for selecting a clock domain at a time in response to a scan capture pulse. The system also includes a one-hot n-to-$2^n$ decoder connected to the shift register and configured to generate one-hot code based on the select data. The system further includes a plurality of integrated clock gating cells (ICGs) connected to the one-hot n-to-$2^n$ decoder, where the scan capture pulse is applied to each one of the plurality of ICGs, and where only one of the plurality of ICGs associated with the clock domain is enabled when the one-hot code is processed by the plurality of ICGs. In addition, the system includes a plurality of multiplexers connected to the plurality of ICGs, where the plurality of multiplexers is configured to forward the scan capture pulse to the clock domain.

In another aspect, a circuit for asynchronously scan capturing multi-clock domains in a SOC during a scan capture operation includes a shift register configured to process select data for selecting a clock domain at a time in response to a scan capture pulse. The circuit also includes a one-hot n-to-$2^n$ decoder connected to the shift register and configured to generate one-hot code based on the select data, where "n" is the number of inputs to the one-hot n-to-$2^n$ decoder and where the shift register comprises "3n" flip-flops. The circuit further includes a plurality of ICGs connected to the one-hot n-to-$2^n$ decoder, where the scan capture pulse is applied to each one of the plurality of ICGs, and where only one of the plurality of ICGs associated with the clock domain is enabled when the one-hot code is processed by the plurality of ICGs. In addition, the circuit includes a plurality of multiplexers connected to the plurality of ICGs, where the plurality of multiplexers is configured to forward the scan capture pulse to the clock domain.

In yet another aspect, a SOC device includes logic circuitry with multi-clock domains, and a system for asynchronously scan capturing the multi-clock domains during a scan capture operation. The system includes a shift register configured to process select data for selecting a clock domain at a time in response to a scan capture pulse. The system also includes a one-hot n-to-$2^n$ decoder connected to the shift register and configured to generate one-hot code based on the select data. The system further includes a plurality of ICGs connected to the one-hot n-to-$2^n$ decoder, where the scan capture pulse is applied to each one of the plurality of ICGs, and where only one of the plurality of ICGs associated with the clock domain is enabled when the one-hot code is processed by the plurality of ICGs. In addition, the system includes a plurality of multiplexers connected to the plurality of ICGs, where the plurality of multiplexers is configured to forward the scan capture pulse to the clock domain.

Other features of the embodiments will be apparent from the accompanying drawings and from the detailed description that follows.

BRIEF DESCRIPTION OF THE VIEWS OF DRAWINGS

Figure 1:
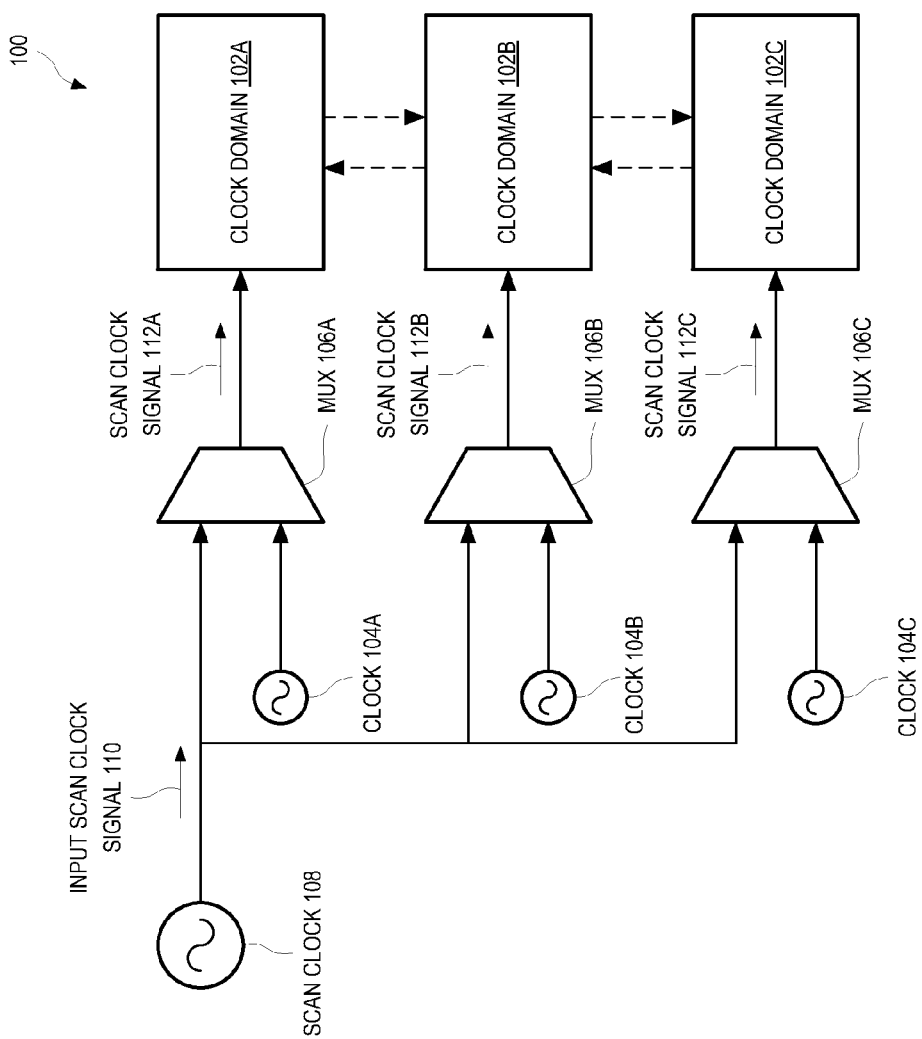
FIG. 1 illustrates a clocking structure of a chip with three clock domains.

The drawings described herein are for illustration purposes only and are not intended to limit the scope of the present disclosure in any way.

DETAILED DESCRIPTION

Systems, circuits, and devices for asynchronously scan capturing multi-clock domains in a system-on-chip (SOC) during a scan capture operation are disclosed. The following description is merely exemplary in nature and is not intended to limit the present disclosure, applications, or uses. It should be understood that throughout the drawings, corresponding reference numerals indicate like or corresponding parts and features.

FIG. 1 illustrates a clocking structure of a chip 100 with three clock domains 102A, 102B and 102C. In normal operation mode of the chip 100, the three clock domains 102A, 102B and 102C are clocked by a clock 104A, a clock 104B, and a clock 104C, respectively, via their respective multiplexers (muxes) 106A, 106B, and 106C, where the clock 104A, the clock 104B, and the clock 104C are asynchronous to each other. From functional point of view, clock trees of the three clock domains 102A, 102B and 102C need not be balanced, and any interface across them is asynchronous. However, in the scan-capture operation of the chip 100, the three clock domains 102A, 102B, and 102C are clocked by a single scan clock 108 which makes the entire interface across the three clock domains 102A, 102B, and 102C synchronous. The scan clock 108 generates an input scan clock signal 110 when the chip 100 is in the scan mode, and synchronous scan clock signals 112A, 112B, and 112C are fed to the clock domains 102A, 102B, and 102C, respectively.

Figure 2:
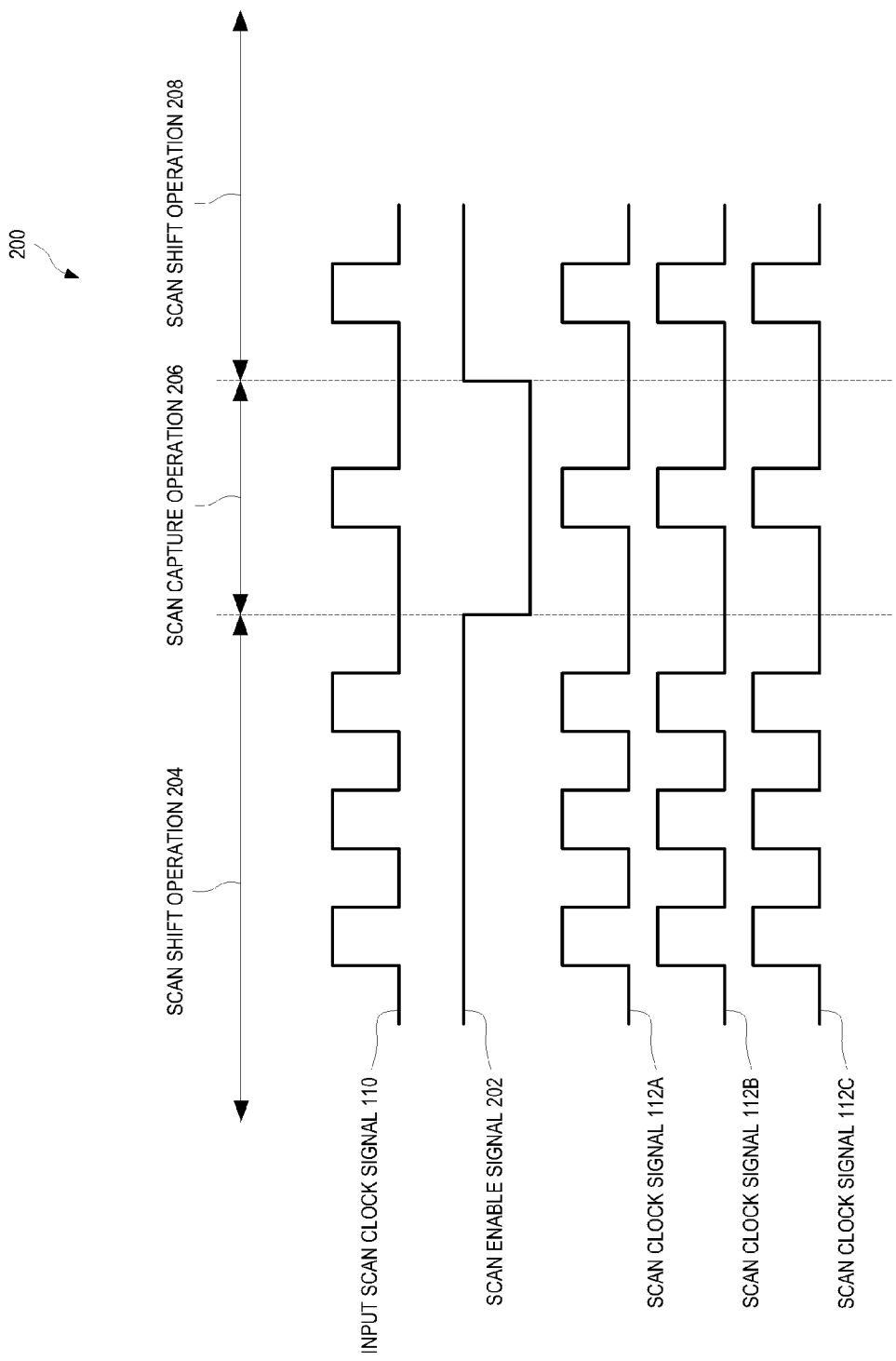
FIG. 2 illustrates a timing diagram associated with the clocking structure of FIG. 1.

FIG. 2 illustrates a timing diagram associated with the clocking structure of FIG. 1. During a scan shift operation 204, where a scan enable signal 202 is set high, test patterns may be loaded to scan chains in the clock domains 102A, 102B, and 102C. Then, during a scan capture operation 206, where the scan enable signal 202 is set low, a pseudo-functional operation of the chip 100 may be performed based on functional inputs to the chip 100 as well as the test patterns loaded to the scan chains. Unlike the scan shift operation 204, which merely moves test patterns across flip-flops in the chip 100, the scan capture operation 206 may involve applying the functional inputs as well as the test patterns to numerous combinational circuits residing in the clock domains 102A, 102B, and 102C. Therefore, the synchronous interfaces based on the single scan clock 108 may require all the clock trees of the three clock domains 102A, 102B, and 102C to be balanced as well as timing closure on all the clock paths. This may be a difficult and time consuming task on large designs having several hundred or thousand clock domains.

Figure 3:
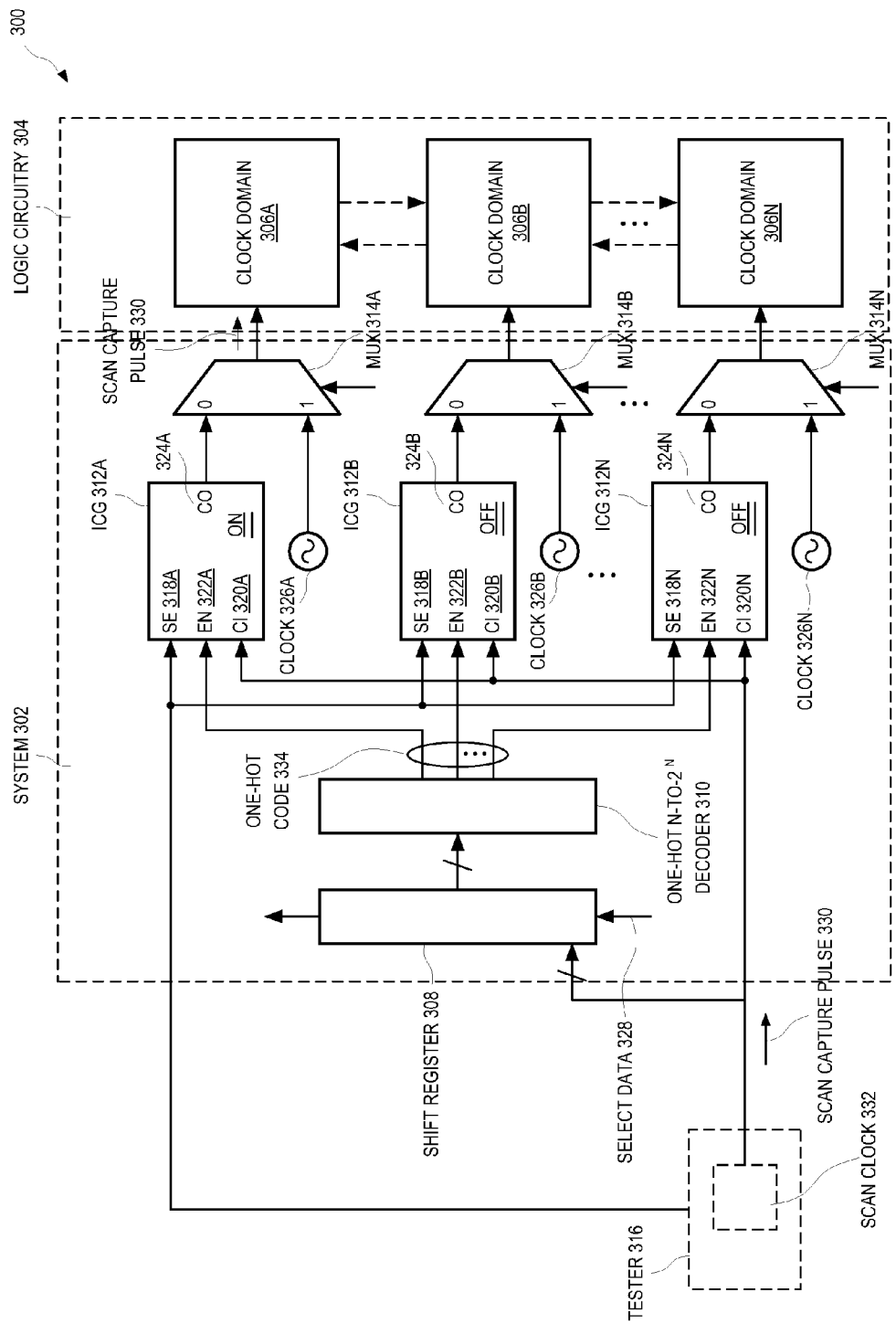
FIG. 3 illustrates an exemplary system for asynchronously scan capturing multi-clock domains in a system-on-chip (SOC) during a scan capture operation, according one embodiment.

FIG. 3 illustrates an exemplary system 302 for asynchronously scan capturing multi-clock domains 306A-N in a SOC 300 during a scan capture operation, according one embodiment. The SOC 300 includes the system 302 and logic circuitry 304 with multi-clock domains 306A-N. The system 302 includes a shift register 308, a one-hot n-to-$2^n$ decoder 310, integrated clock gating cells (ICGs) 312A-N, and multiplexers 314A-N.

In the system 302, the one-hot n-to-$2^n$ decoder 310 is connected to the shift register 308 which is connected to a tester 316. The ICGs 312A-N are connected to the one-hot n-to-$2^n$ decoder 310 and to the tester 316. As illustrated, scan enable (SE) nodes 318A-N and clock input (CI) nodes 320A-N of the ICG 312A-N are connected to the tester 316. Further, function enable (EN) nodes 322A-N are connected to corresponding output nodes of the one-hot n-to-$2^n$ decoder 310. Each one of the multiplexers 314A-N is connected to respective one of the ICGS 312A-N. The multiplexers 314A-N are coupled to clock output (CO) nodes 324A-N of the ICGs 312A-N, respectively. The multiplexers 314A-N are also connected to individual clocks 326A-N, where each one of the clocks 326A-N is dedicated for a corresponding one of the multi-clock domains 306A-N.

In normal mode of operation of the SOC 300, the multi-clock domains 306A-N are clocked by the individual clocks 326A-N via their respective multiplexers 314A-N, where the individual clocks 326A-N are asynchronous to each other. However, in the scan capture mode of operation of the SOC 300, the shift register 308, which may be a part of the scan chain(s) in the SOC 300, processes select data 328 (e.g., a part of the test pattern(s)) in response to a scan capture pulse 330 generated by a scan clock 332 of the tester 316 (e.g., which initiated the scan capture operation). The select data 328 enables selection of a single clock domain at a time for performing the scan capture operation. Accordingly, the one-hot n-to-$2^n$ decoder 310 generates one-hot code 334 or code having one enable bit based on the select data 328. The one-hot n-to-$2^n$ decoder 310 then forwards the one-hot code 334 to the EN nodes 322A-N of the ICGs 312A-N as function enable (EN) signals. At the same time, the tester 316 applies a logical low SE signal to the SE nodes 318A-N and the scan capture pulse 330 to the CI nodes 320A-N. Based on the one hot-code 334, only one of the ICGs 312A-N associated with corresponding one of the multi-clock domains 306A-N is enabled during the scan capture operation. Accordingly, respective one of the multiplexers 314A-N associated with the clock domain (e.g., the multiplexer 314A) selected for the scan capture operation forwards the scan capture pulse 330 to the clock domain (e.g., the clock domain 306A) to perform the scan capture operation of the SOC 300. It is appreciated that when the ICG 312A is ON, the ICGs 312B-N are OFF and hence the system 302 does not generate the scan capture pulse 330 for the other clock domains 306B-N. This way, only single clock domain (e.g., the clock domain 306A) in the multi-clock domains (e.g., the clock domains 306A-N) is enabled to receive the scan capture pulse (e.g., the scan capture pulse 330) at a time, thus avoiding timing issues associated with executing multi-clock domains synchronously based on the single scan clock 332.

Figure 4:
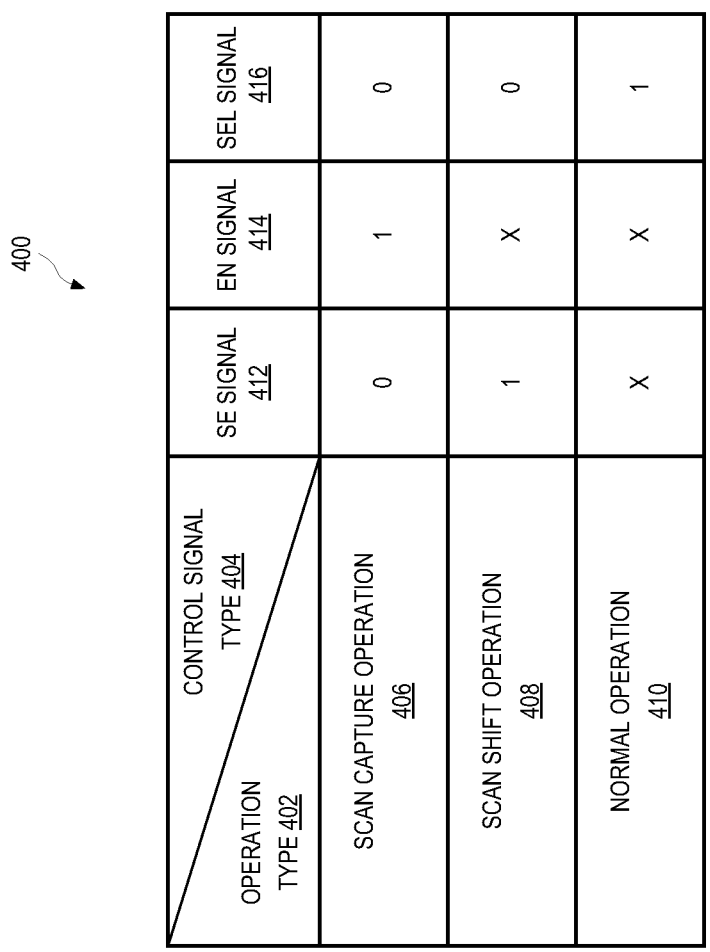
FIG. 4 is a table illustrating different operations of the system in FIG. 3.

FIG. 4 is a table 400 illustrating exemplary operations of the system 302 in FIG. 3. In particular, the table 400 illustrates an operation type 402 of the system 302, such as a scan capture operation 406, a scan shift operation 408, and a normal operation 410, as well as a control signal type 404 associated with the operation type 402, such as a SE signal 412, an EN signal 414, and a SEL signal 416. During the scan capture operation 406 of the system 302, the SE signal 412 to the SE nodes 318A-N of the ICGs 312A-N is set inactive (e.g., a logical value '0'). Further, an EN signal 414 to the ICG 312A associated with the clock domain 306A is set active (e.g., a logical value '1'). At the same time, the SEL signal 416 to the multiplexers 314A-N enables the multiplexers 314A-N to pass the scan capture pulse 330 from the ICG 312A to the selected clock domain 306A.

Figure 5:
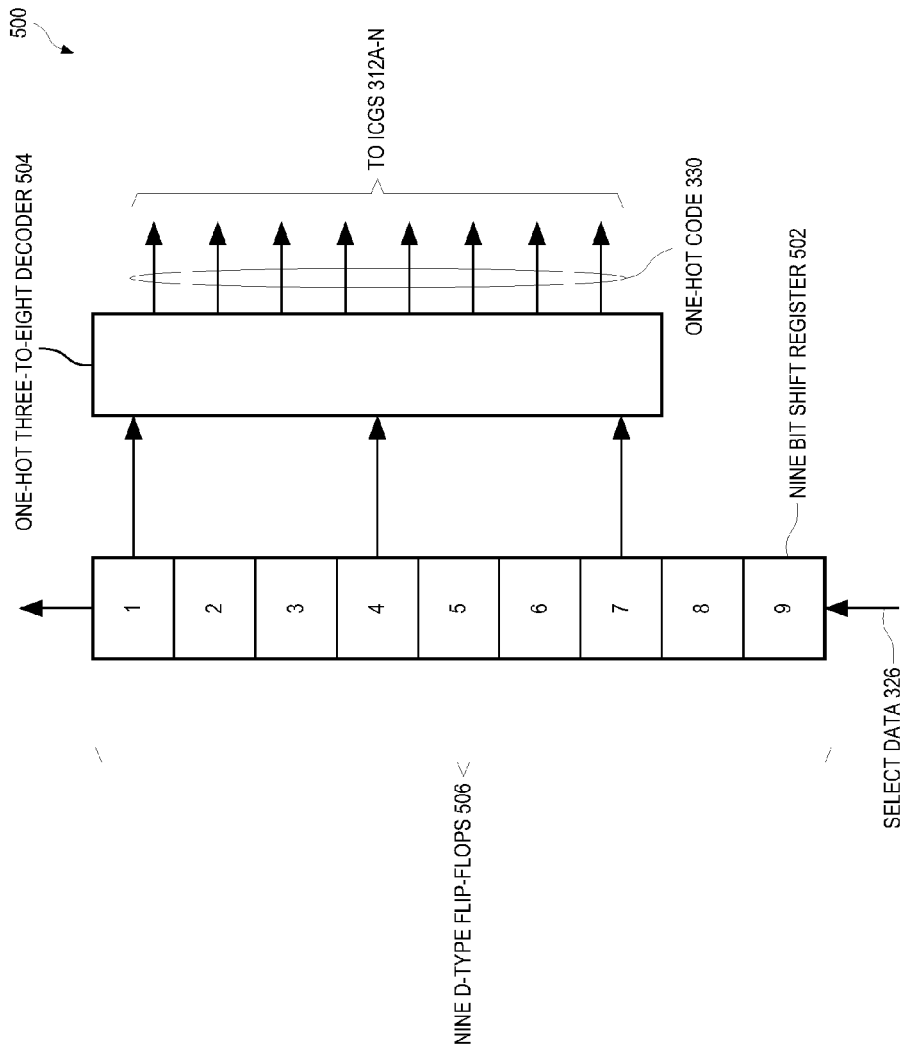
FIG. 5 illustrates an exemplary combination of a shift register and a one-hot n-to-$2^n$ decoder in the system of FIG. 3.

During the scan shift operation 408 of the system 302, where the SE signal 412 to the ICGs 312A-N is set active and the SEL signal 416 is set inactive, the ICGs 312A-N forward a scan shift pulse to the multiplexers 314A-N. The multiplexers 314A-N then forward the scan shift pulse to the multi-clock domains 306A-N. During the normal operation 410 of the system 302, where the SEL signal 416 is set active, the multiplexers 314A-N forward clock signals from the clocks 326A-N to corresponding multi-clock domains 306A-N FIG. 5 illustrates an exemplary combination of the shift register 308 and the one-hot n-to-$2^n$ decoder 310 in the system 302 of FIG. 3. In particular, FIG. 5 illustrates a nine bit shift register 502, which is an example embodiment of the shift register 308, and a one-hot three-to-eight decoder 504, which is an example embodiment of the one-hot n-to-$2^n$ decoder 310. In one example implementation, the nine bit shift register 502 includes nine D-type flip-flops 506 connected in series. Also, in one example implementation, the one-hot three-to-eight decoder 504 connected to the nine bit shift register 502 includes nine three-input AND gates (not shown), where the first, fourth, and seventh ones of the nine D-type flip-flops 506 are connected to the one-hot three-to-eight decoder 504. It is appreciated that the nine three-input AND gates are configured to generate a single enable bit, i.e., the one-hot code 334, based on the select data 326.

In one exemplary operation, during the scan capture operation mode of the system 302, the nine bit shift register 502 processes the select data 328, where the first, fourth, and seventh ones of the select data 328 in the nine bit shift register 502 are fed to the one-hot three-to-eight decoder 504 to generate the one-hot code 334. As a result, only one of the ICGs 312A-N is enabled, thus feeding a single scan capture pulse to a selected clock domain at a time.

In one embodiment, in the system 302, a circuit implementing the system 302 includes a shift register of "3n" width for a decoder with 'n' inputs. In the example embodiment illustrated in FIG. 5, for the one-hot three-to-eight decoder 504, which has three inputs, the nine bit shift register 502, which has nine flip-flops, is used in the system 302. Further, every third bit of the nine bit shift register 502 is provided as an input to the one-hot three-to-eight decoder 504. This may help in generating clock-sequential patterns up to three such that three scan capture pulses may be processed to capture three different clock domains in sequence, as will be illustrated in FIG. 6C. For example, in the nine bit shift register 502, the first bit, the fourth bit and the seventh bit may be used to determine a clock domain selected for the first scan capture pulse (e.g., the clock domain 306A). In addition, the second bit, the fifth bit and the eight bit may be used to determine a clock domain selected for the second scan capture pulse (e.g., the clock domain 306B). Further, the third bit, the sixth bit and the ninth bit may be used to determine a clock domain selected for the third scan capture pulse (e.g., a clock domain 306C which is not shown in the figure).

Figure 6A:
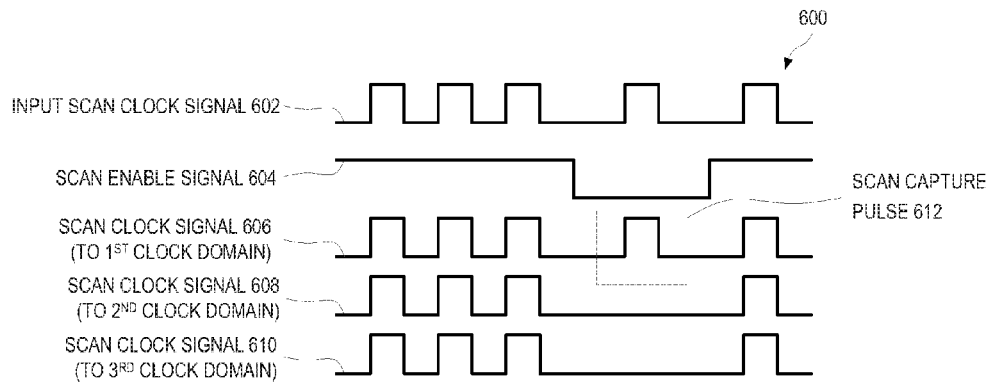
FIGS. 6A-6C illustrate timing diagrams associated with the system of FIG. 3.
Figure 6B:
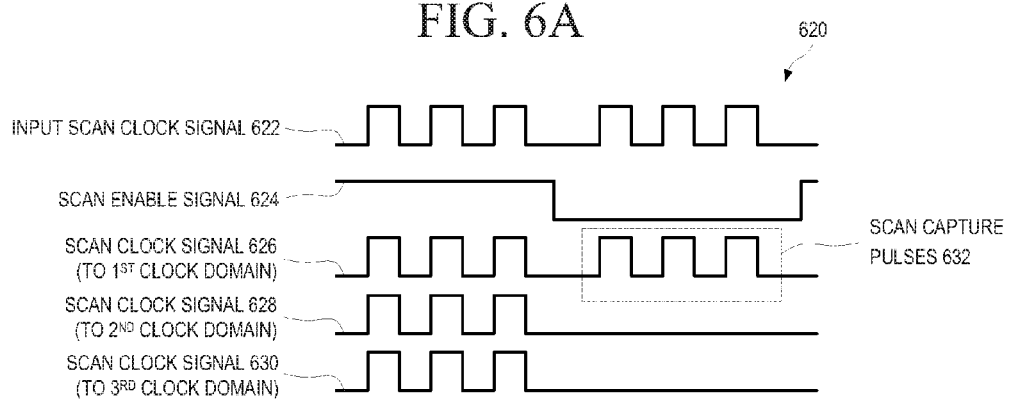
Figure 6C:
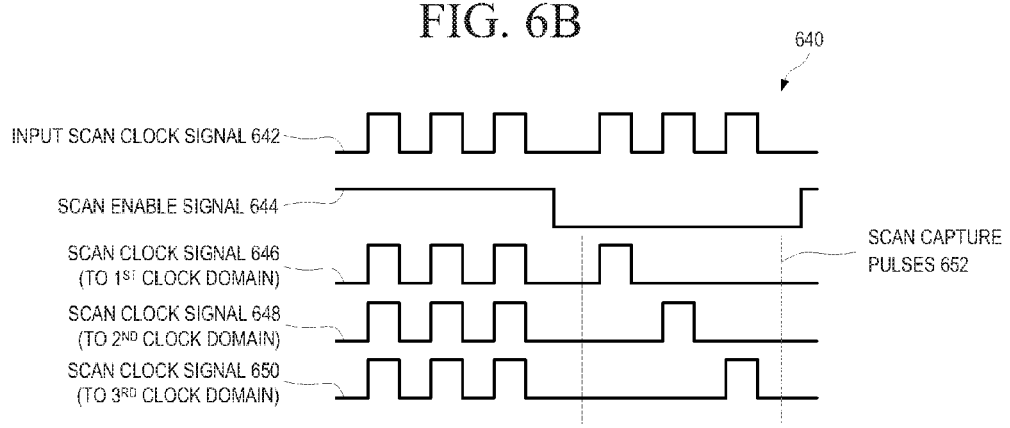

FIGS. 6A-6C illustrate timing diagrams 600, 620, and 640 associated with the system 302 of FIG. 3. In particular, FIG. 6A illustrates a timing diagram 600 for a basic scan capture operation of the system 302 with three clock domains 306A-C. A scan shift operation is performed when a scan enable signal 604 is set active (e.g., logical high). During the scan shift operation, a scan shift pulse (e.g., indicated by an input scan clock signal 602) is fed to all the clock domains. Further, when the scan enable signal 626 is set inactive (e.g., logical low), a scan capture operation may be initiated. During the scan capture operation, a scan clock signal 606 associated with the first clock domain (e.g., the clock domain 306A) is set active, whereas a scan clock signal 608 associated with the second clock domain (e.g., the clock domain 306B) and a scan clock signal 610 associated with the third clock domain (e.g., the clock domain 306C) are set inactive. That is, during the scan capture operation, a scan capture pulse 612 is applied to the first clock domain, whereas no scan capture pulse is applied to the second clock domain and the third clock domain.

FIG. 6B illustrates a timing diagram 620 for a clock-sequential capture operation of the system 302 within a single clock domain. In the timing diagram 620, a scan shift operation is performed when a scan enable signal 624 is set active (e.g., logical high). During the scan shift operation, a scan shift pulse (e.g., indicated by an input scan clock signal 622) is forwarded to all the three clock domains. Further, when the scan enable signal 624 is set inactive (e.g., logical low), a scan capture operation may be initiated. During the scan capture operation, a scan clock signal 626 associated with the first clock domain is set active, whereas a scan clock signal 628 associated with the second clock domain and a scan clock signal 630 associated with the third clock domain are set inactive. That is, during the scan capture operation, multiple sequential scan capture pulses 632 are applied to the first clock domain, whereas no scan capture pulse is applied to the second clock domain or the third clock domain.

FIG. 6C illustrates a timing diagram 640 for a clock-sequential capture operation of the system 302 across three clock domains. In the timing diagram 640, a scan shift operation is performed when a scan enable signal 644 is set active (e.g., logical high). During the scan shift operation, a scan shift pulse (e.g., indicated by an input scan clock signal 642) is forwarded to all the three clock domains. Further, when the scan enable signal 644 is set inactive (e.g., logical low), a scan capture operation may be initiated. During the scan capture operation, three scan capture pulses 652 are generated asynchronously for the first clock domain, the second clock domain and the third clock domain in sequence as a scan clock signal 646, a scan clock signal 648, and a scan clock signal 650 are individually applied to the three clock domains. Thus, the clock-sequential capture operation in FIG. 6C may enable capturing responses of the three clock domains asynchronously without any timing issues. It is appreciated that the scan capture pulses illustrated in FIGS. 6A-6C as well as other types of scan capture pulses may be generated using the system 302 based on different configurations of the select data 328.

In various embodiments, the systems, circuits and devices described in FIGS. 3-6 may enable asynchronous scan capturing of multi-clock domains using a single scan clock from a tester without any timing issues. The above-described systems, circuits and devices may provide a mutually exclusive scan capture pulse(s) across the multi-clock domains, thereby enabling ease of timing closure for a scan mode, efficient patterns generations and pattern count, and improvements in clock tree design. Further, the above-described systems, circuits and devices may facilitate reduction in area of a SOC device due to usage of less number of hold buffers. In addition, it is appreciated that the above-described systems, circuits and devices may use a shift register which is a part of a scan chain itself, hence no additional shift register may be required. Moreover, the above-described systems, circuits and devices may enable easy setting up of an ATPG flow and efficient use of ATPG tool algorithm.

The various devices, modules, analyzers, generators, etc. described herein may be enabled and operated using hardware circuitry (e.g., complementary metal-oxide-semiconductor (CMOS) based logic circuitry), firmware, software and/or any combination of hardware, firmware, and/or software (e.g., embodied in a machine readable medium). Further, the various electrical structure and methods may be embodied using transistors, logic gates, and/or electrical circuits (e.g., application specific integrated circuit (ASIC)). Although the present embodiments have been described with reference to specific example embodiments, it will be evident that various modifications and changes may be made to these embodiments without departing from the broader spirit and scope of the various embodiments.

What is claimed is:

1. An integrated circuit comprising:
   A. logic circuitry clock domains, each clock domain having a separate clock input;

B. function clock circuits, each function clock circuit having a function clock output and the function clock circuits being asynchronous with one another;
C. a test clock lead, a scan enable lead, and a select lead;
D. a shift register having a serial input, a serial output, and parallel outputs;
E. decoder circuitry having parallel inputs connected to the parallel outputs of the shift register and having enable outputs, there being one enable output for each clock domain;
F. clock gating circuitry for each of the logic circuitry clock domains, each clock gating circuitry having a clock input coupled to the test clock lead, a scan enable input connected to the scan enable lead, an enable input connected to one of the enable outputs of the decoder circuitry, and a gated clock output; and
G. multiplexer circuitry for each of the logic circuitry clock domains, each multiplexer circuitry having a first input connected to one of the gated clock outputs, a second input connected to one of the function clock outputs, a control input connected to the select lead, and an output connected to the clock input of one of the logic circuit clock domains.

2. The integrated circuit of claim 1 in which the shift register includes clock inputs that are coupled to the test clock lead.

\* \* \* \* \*